United States Patent [19]

Kinsbron et al.

[11] 4,343,677
[45] Aug. 10, 1982

[54] METHOD FOR PATTERNING FILMS USING REACTIVE ION ETCHING THEREOF

[75] Inventors: Eliezer Kinsbron, Highland Park; Hyman J. Levinstein, Berkeley Heights; William E. Willenbrock, Jr., Manchester Township, Ocean County, all of N.J.

[73] Assignee: Bell Telephone Laboratories, Incorporated, Murray Hill, N.J.

[21] Appl. No.: 246,690

[22] Filed: Mar. 23, 1981

[51] Int. Cl.³ ............... B44C 1/22; H01L 21/306; C03C 15/00; C23F 1/02
[52] U.S. Cl. .................. 156/643; 156/644; 156/646; 156/652; 156/659.1; 156/668; 204/192 E; 427/43.1
[58] Field of Search ............ 156/643, 644, 646, 652, 156/653, 656, 657, 659.1, 668, 638, 655; 252/79.1, 79.2, 79.3, 79.4; 204/192 E; 430/317, 318; 427/43.1, 41

[56] References Cited

U.S. PATENT DOCUMENTS

| 3,930,913 | 1/1976 | Jacob | 156/345 X |
| 4,092,442 | 5/1978 | Agnihotri et al. | 430/317 |
| 4,244,799 | 1/1981 | Fraser et al. | 204/192 |
| 4,256,534 | 3/1981 | Levinstein et al. | 156/643 |

OTHER PUBLICATIONS

Bell System Technical Journal, vol. 58, (1979) "High Resolution, Steep Profile, Resist Patterns", pp. 1027-1036, by J. M. Moran and D. Maydan.

Primary Examiner—William A. Powell
Attorney, Agent, or Firm—David I. Caplan

[57] ABSTRACT

In the patterning of an organic layer on a VLSI wafer by means of reactive oxygen (or other) ion anisotropic etching, build-ups of oxides (or other compounds) on the sidewalls of apertures formed in the organic layer are removed prior to etching the material, typically aluminum, of the VLSI wafer located at the bottom of these apertures, using the patterned organic layer as an etch mask.

22 Claims, 5 Drawing Figures

METHOD FOR PATTERNING FILMS USING REACTIVE ION ETCHING THEREOF

FIELD OF INVENTION

This invention relates to the field of methods for patterning films and, more particularly, to methods for patterning films using reactive ion etching.

BACKGROUND OF THE INVENTION

Etching a layer or film by reactive ion (sputter) etching is useful in a variety of contexts, more specifically in the art of semiconductor integrated circuit manufacturing. The term "sputter" is added to denote those physical processes, in addition to the chemically reactive processes, which can aid the etching.

For example, a paper authored by J. M. Moran and D. Maydan, entitled, "High Resolution, Steep Profile, Resist Patterns," published in *The Bell System Technical Journal*, Vol. 58, pp. 1027–1036 (1979), describes a "tri-level" process for generating a desired pattern (of mask portions and window portions) in a relatively thick (2.6 micron) organic film or layer, i.e., a layer of chemically organic material. The bottom surface of the organic layer is conformal with the steps on a top major surface of a VLSI wafer to be selectively etched using, as a selective etch mask, the organic layer after it has been patterned. By "VLSI wafer" is meant a semiconductor body which contains "*v*ery *l*arge *s*cale *i*ntegrated circuits" at a major surface thereof. The purpose of the patterning of the organic layer is to enable the use of the resulting patterned organic layer as a mask for selective etching of underlying substance or material of the VLSI wafer at the bottom of the windows.

The top surface of the organic layer before patterning is planar for the purpose of good resolution in the ultimate etch patterning of the VLSI wafer. The chemical composition of the organic layer is typically that of a photoresist material. Patterning of this organic layer is achieved by coating it with a relatively thin (about 0.12 micron) intermediate layer of silicon dioxide and a relatively thin top layer of resist sensitive to x-ray, electron, ion, or optical radiation.

The organic layer together with the intermediate layer of silicon dioxide and the top layer of resist form a "tri-level" system. After exposing the top resist layer to a pattern of x-rays, electrons, or light and subsequently developing this top resist layer in accordance with the pattern (about 0.4 micron thick at mask portions, zero at window portions), the intermediate layer of silicon dioxide is selectively etched in accordance with the pattern by CHF$_3$ or reactive ion etching, using the thus patterned top resist layer as a selective mask against etching. Next, the thick organic layer is selectively etched to form a patterned organic layer (i.e., patterned with apertures or windows therein) by means of reactive oxygen ion anisotropic (vertical wall) sputter etching in pure oxygen gas, using the thus patterned intermediate silicon dioxide layer as a selective mask (the top resist layer ordinarily being completely removed by the reactive oxygen ion etching). Thereby, the VLSI wafer could be further processed—as by etching, implantation, deposition, etc.—as desired for the fabrication of the integrated circuits at the major surface of the wafer, utilizing the thus patterned organic layer as a selective mask therefore.

Ordinarily, at some time prior to the completion of the integrated circuits, the patterned organic layer is removed, for example, by dissolving the layer by means of a suitable organic solvent, such as a mixture of dimethyl sulfoxide and anhydrous hydrazine, as disclosed in greater detail in the patent application entitled "Removing Hardened Organic Materials During Fabrication of Integrated Circuits," Ser. No. 214,171 filed on Dec. 8, 1980, by E. Kinsbron and F. Vratny, having one of the inventors in common herein.

In a typical case, the material or substance of the VLSI wafer located at the bottom of the windows in the patterned organic layer is essentially metallic aluminum for interconnecting the various integrated circuit elements on the VLSI wafer. In such cases, this aluminum is then selectively anisotropically etched, using the patterned organic layer as an etch mask, by reactive ion etching with a mixture of ions of boron trichloride (BCl$_3$) and chlorine (Cl$_2$) with or without added helium. Such reactive ion etching also removes the intermediate silicon dioxide layer of the "tri-level" system. In any event, this etching selectively removes the aluminum only at the bottom of the windows in the patterned organic layer. It has been observed by workers in the art that, after this selective etching of the aluminum, build-ups of material remain on the sidewalls of the windows in the patterned organic layer. These build-ups are not soluble in the organic solvent used to dissolve the patterned organic layer, and therefore these build-ups collapse in pieces onto the surface of the VLSI wafer when the patterned organic layer is dissolved; thereby, the collapsed pieces of these build-ups cause mechanical abrasions or scratches as well as obstruct subsequent VLSI processing steps, such as encapsulation of the VLSI circuits in silicon nitride.

Workers in the art have believed that these sidewall build-ups are formed during the reactive ion etching of the aluminum, as an end-product of that etching. Accordingly, it has not been appreciated that these build-ups can undesirably interfere with the resolution achievable from etching the aluminum using the patterned organic layer as a mask, as well as interfere with the subsequent removal of the patterned organic layer during the ordinary further processing of the VLSI wafer.

SUMMARY OF THE INVENTION

We have found that undesirable build-ups on the sidewalls of windows in a patterned organic layer, at the bottom of the windows of which is located aluminum or other underlying substance(s), form during earlier reactive ion sputter etching of the organic layer; hence, these build-ups can also undesirably modify the contours of the pattern of the masking afforded by the organic layer, against subsequent etching of the aluminum, since these build-ups act as added unexpected masks. In accordance with the invention, these sidewall build-ups are removed after the reactive ion sputter etching of the organic layer, advantageously before any further processing steps, and in any event before etching the aluminum or other underlying substance when these build-ups would cause undesirable effects. More specifically, the build-ups are removed by dissolving them in a suitable solvent. The choice of this last-mentioned solvent depends upon the nature of the underlying substance located at the bottom of the windows of the patterned organic layer, since the build-ups form as a result of the reaction of the ions with this substance during the final or terminal phase of the sputter etching of the organic layer with these ions; that is, during a phase when the underlying substance becomes exposed to the ions. Thus the build-ups are composed of compounds of this underlying substance with the ions, generally mixed with the organic layer; hence the solvent for removing the build-ups should be chosen accordingly. At any rate, the build-ups have a tendency to be resistant against removal by dry etching techniques, including reactive ion etching. Indeed, the build-ups originally form and persist during the reactive ion etching of the organic layer because of this tendency of the build-ups to be resistant against removal.

In its broader aspects, this invention thus involves a method for processing a film having a major surface initially everywhere coated with a layer of substance which is then selectively etched using as a selective etch mask an organic layer, said organic layer having been patterned with windows, said windows penetrating through the organic layer to the layer of substance, and said windows formed by means of a reactive ion etching step, characterized by the step of removing builds-ups of compounds of the substance from sidewalls of the windows prior to selectively etching the layer of substance. When the reactive ion etching is done with oxygen ions, these compounds are oxides. The reactive ion etching step to form the windows in the organic layer is ordinarily anisotropic; that is, the etching produces windows having substantially vertical sidewalls.

In a specific embodiment of the invention, an organic resist layer on a VLSI wafer is patterned using reactive oxygen ion anisotropic sputter etching—that is, using oxygen ions. At the bottom of the resulting windows in the patterned organic layer is located metallic aluminum. Sidewall build-ups, of oxides of the aluminum combined with organic resist itself, which form during the reactive oxygen ion etching, are removed prior to etching of the aluminum at the bottom of the apertures. These sidewall build-ups can be removed, for example, by a treatment with a liquid solvent such as ethylene glycol and hydrofluoric acid (HF) buffered with ammonium fluoride ($NH_4F$). After removal of the build-ups, the aluminum at the bottom of the windows is selectively etched, for example, with $BCl_3$ and $Cl_2$ ions, using the patterned organic layer as a mask against etching. Then the patterned organic layer can be removed by another (this time, isotropic) reactive oxygen ion etching step advantageously in situ, that is, in the same chamber in which the aluminum was etched, and without removing the VLSI wafer from this chamber during the time interval between the selective etching of the aluminum and the removal of the patterned organic layer.

In other specific embodiments of the invention, other substances than aluminum are located on the surface of the VLSI wafer at the bottom of the windows in the patterned organic layer which has been patterned by a reactive oxygen ion anisotropic etching step. Suitable solvents remove oxides of these substances from the sidewalls of the windows after the reactive oxygen ion anisotropic etching step and before etching of these substances. In still other specific embodiments, reactive ion etching of the organic layer is performed with ions other than oxygen, such as chlorine.

BRIEF DESCRIPTION OF THE DRAWING

This invention together with its objects, features, and advantages can be better understood from the following detailed description when read in conjunction with the drawing in which.

Figure 1:
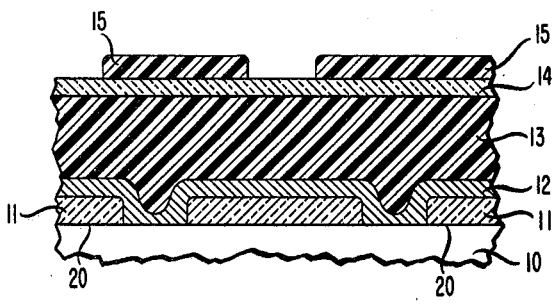
FIGS. 1–5 are sectional views of various stages of the processing of a thin film in accordance with a specific embodiment of the invention.

Only for the sake of clarity, the drawing is not to any scale.

DETAILED DESCRIPTION

FIG. 1 depicts a structure being processed comprising VLSI wafer 10 having a top major surface 20 at which is located an essentially insulating layer 11 and an aluminum layer 12. The insulating layer 11 typically is essentially silicon dioxide which may or may not contain a coating (not shown) or silicon nitride or other insulator. This layer 11 typically also includes in its interior such noninsulating elements as polycrystalline silicon strips (not shown) for the purpose of supplying gate electrodes for VLSI transistors (not shown) in the integrated circuits of the VLSI wafer 10; however, the exposed surface of this layer 11 is ordinarily insulating. The aluminum layer 12 makes contact with the top surface 10 of the VLSI wafer 10 through apertures in the insulating layer 11, for the purpose of furnishing, for example, electrical contact to the source and drain regions (not shown) of the VLSI transistors. The aluminum layer 12 originally covers the entire exposed portions of the surfaces of the insulating layer 11 and of the VLSI wafer 10.

Figure 3:
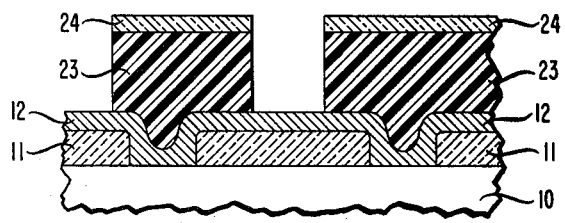
Figure 4:
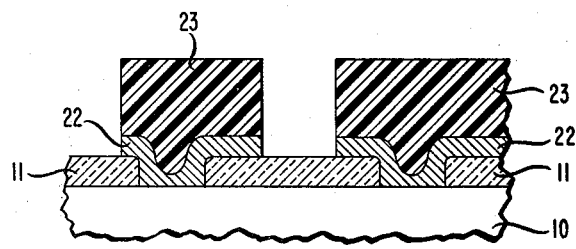
Figure 5:
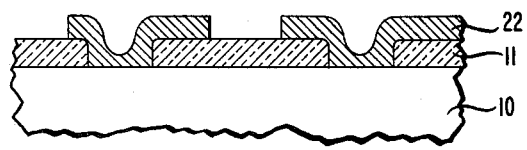

In the process being described (FIGS. 1–5), it is desired to etch the aluminum layer 12 at selected portions thereof to form a patterned aluminum metallization layer 22 (FIG. 5). For this purpose, a relatively thick organic layer 13 (FIG. 1) coats the exposed surface of the aluminum layer 12; a relatively thin silicon dioxide layer 14 coats the exposed surface of the organic layer 13; and a patterned photoresist layer 15 coats the silicon dioxide layer 14 except at locations of windows in the photoresist layer 15. These windows are located directly overlying (in registration with) the desired portions to be etched in the aluminum layer 12.

The organic layer 13 is typically a polymer layer of thickness about 1.8 micron. A suitable polymer for the organic layer 13 polyimide designated PIQ made by Hitachi-Ltd., Tokyo, Japan, or a polyimide designated Pyralin made by E. I. DuPont de Nemours and Co., Wilmington, Del., or a class of novalac-type resists designated HPR made by Philip A. Hunt Chemical Corp., Palisades Park, N.J. Further suitable organic materials for the layer 13 include such standard products as KPR, KMER, AZ1350, and Polychrome resists. Ordinarily, high-temperature baking of the organic layer, typically for about 30 to 180 minutes at about 200 to 300 degrees Celsius, prior to patterning of this layer is advisable in order to harden the organic material thereof and make the patterns therein resistant to further processing steps, such as plasma etching.

The silicon dioxide layer 14 is typically about 0.12 micron thick, as produced by standard plasma deposition, for example. The purpose of this silicon dioxide layer 14 is to serve after patterning as an intermediate patterned masking layer 24 (FIG. 2) useful for selectively protecting the organic layer 13 during subsequent patterning thereof to form a patterned organic layer 23 (FIG. 2) by reactive oxygen ion anisotropic etching.

The patterned photoresist layer 15 is typically about 1.0 micron thick, the apertures therein having been formed by standard photolithographic processing, for example.

Figure 2:
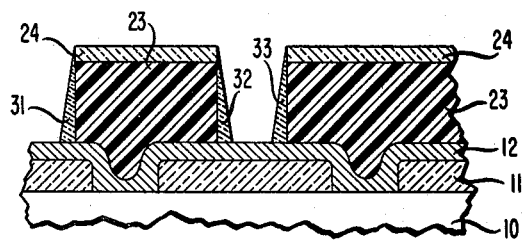

In order to bring the structure shown in FIG. 1 to the stage indicated in FIG. 2: First, subject the silicon dioxide layer 14 to a reactive ion etching step with CHF$_3$, for example, using the patterned photoresist layer 15 as a mask against such etching. Thereby, the silicon dioxide layer 14 becomes the intermediate patterned masking layer 24 of silicon dioxide. Then subject the (hardened) organic layer 13 to a reactive oxygen ion anisotropic etching step. This etching will also completely remove the patterned photoresist layer 15, so that the remaining intermediate silicon dioxide layer 24 is thus used as the effective mask against oxygen ion etching of the organic layer 13.

The reactive oxygen ion etching of the organic layer 13 is done using pure oxygen gas (partially ionized) or a gas mixture (partially ionized) of oxygen and about 0.5 to 1.0% by volume carbon tetrafluoride (CF$_4$), at relatively low pressure and relatively high RF power, as set forth in greater detail below, in order to ensure good anisotropy in the etching; that is, to ensure steep smooth walls for the windows in the organic layer 13. Thus, the organic layer 13 becomes a patterned organic layer 23. At the same time, inpingement of oxygen ions on the exposed aluminum of the layer 12 at the bottom of the windows of the patterned organic layer 23, during normal "overetching" or terminal phases of the etching with oxygen, produces sidewall build-ups 31, 32, 33 on the sidewalls of these windows. Typically, in order to ensure complete formation of the windows in the organic layer, sufficient to expose the aluminum, an extra 50% etching ("overetching") time is added. These sidewall build-ups 31, 32, 33 also extend over the sidewalls and adjacent top surface portions of the patterned intermediate masking layer 24.

In accordance with the invention, these build-ups 31, 32, 33 are to be removed (FIG. 3), prior to selective etching of the aluminum layer 12 (FIG. 4).

In order to remove the build-ups 31, 32, 33 the structure shown in FIG. 2 is subjected to a treatment with a suitable solvent for dissolving the oxides of the aluminum (or other substances in other embodiments of the invention) from the layer 12 of which these build-ups are composed. In particular, for the case of aluminum in the layer 12, a suitable solvent is a liquid mixture of ethylene glycol and buffered hydrofluoric acid, typically in the molar ratio of about 2:1. The buffered hydrofluoric acid is typically ammonium fluoride (NH$_4$F) and hydrofluoric acid (HF) in the molar ratio of about 10:1. A treatment of about 2 to 5 minutes with this liquid mixture at room temperature is typical for removal of the sidewall build-ups 31, 32, 33. At the same time, an upper portion (as much as 50% or more of the total thickness) of the intermediate layer 24 is also removed by the buffered HF.

FIG. 3 depicts the structure being processed just after removal of the sidewall build-ups. The next step is selective etching of the aluminum, that is, the removal of aluminum at the bottom of the windows in the patterned organic layer 23. For this purpose, typically the structure is exposed to an anisotropic ion etching, with the boron trichloride and chlorine, for example, with the boron trichloride (flow rate of about 30 cm$^3$/minute) and chlorine (about 10 cm$^3$/minute) at a total pressure of about 20 micron Hg (including residual pressure), using an RF power of about 170 watts, and a power density of about 0.16 watt/cm$^2$, with the structure mounted on a cathode which is DC biased at about −270 volt. Alternatively, plasma etching with boron trichloride and chlorine can be used, as described in more detail in U.S. Pat. No. 4,256,534, issued to H. J. Levinstein et al. on Mar. 17, 1981, entitled "Device Fabrication by Plasma Etching." This etching of the aluminum layer 12 yields the patterned aluminum metallization layer 22 and also removes completely the patterned intermediate silicon dioxide layer 24, as indicated in FIG. 4.

Next the patterned organic layer 23 itself can be completely removed by an in situ etching step; that is, etching accomplished in the same reaction chamber in which the anisotropic etching of the aluminum was done, without taking the structure being processed out of this chamber. For this purpose of in situ removal of the patterned organic layer 23, a second reactive oxygen ion etching step can be used; this time, substantially isotropic etching, however, by virtue of the use of relatively high pressure and relatively low RF power, as set forth in greater detail below. In this way, the second reactive ion etching step removes the organic layer 23 completely. The structure being processed is thereby brought into the condition shown in FIG. 5.

The first reactive oxygen ion etching step (FIG. 1–FIG. 2), as indicated above, is carried out at a relatively low pressure and relatively high RF power density, in order to yield anisotropic etching of the organic layer 13. A useful oxygen ion pressure for this purpose is in the range of about 2 to 4 micron Hg, typically about 3.5 micron Hg; a useful RF power density is in the range of about 0.25 to 0.75 watt/cm$^2$, typically about 0.5 watt/cm$^2$, at a typical frequency of about 13.56 MHz.

The second reactive ion etching step (FIG. 4–FIG. 5) is carried out at a relatively high pressure and low RF power density, in order to yield isotropic etching of the patterned organic layer 23, in particular, in order to attack this layer 23 from its sides. A useful oxygen ion pressure for this purpose is in the range of about 100 to 200 micron Hg, typically about 150 micron Hg; a useful RF power density is in the range of about 0.1 to 0.3 watt/cm$^2$, typically about 0.2 watt/cm$^2$, at a typical frequency of about 13.56 MHz.

It should be noted that an attempt to remove the sidewall build-ups after, rather than before, the aluminum etching resulted in undesirable undercutting of the aluminum.

Although the invention has been described in detail with reference to a specific embodiment, various modifications can be made without departing from the scope of the invention. For example, instead of the use of the liquid mixture of buffered HF for dissolving the sidewall build-ups, other liquid mixtures can be used or dry (plasma or ion) etching techniques can be used. Also, instead of removing the patterned organic layer 23 by oxygen ion etching, other techniques can be used, such as dissolution by a mixture of anhydrous hydrazine and DMSO (dimethylsulfoxide) in the molar ratio of about 4:1.

Moreover, this invention is applicable for patterning substances other than by the "tri-level" process, such as the so-called "bi-level" process which omits the intermediate layer 24. In general, whenever the terminal phases of reactive oxygen ion etching of an organic layer produce undesirable sidewall build-ups of oxides or other compounds of the substance underlying the organic layer, the build-ups are advantageously removed, according to the invention, after this reactive ion etching of the organic layer and before selectively etching the underlying substance. Also, other reactive ion anisotropic etching species than oxygen, such as chlorine in conjunction with a thicker intermediate layer, can produce build-ups on the sidewalls of the patterned organic layer; and these build-ups comprising compounds of the reactive ion species with the underlying substance likewise, in accordance with the invention, are removed after reactive chlorine ion etching of this organic layer. Finally, substances other than aluminum at the bottom of the sidewalls of the windows in the organic layer can similarly produce undesired build-ups of oxides on the sidewalls. For example, the substances silicon and silicon dioxide produce build-ups of oxides of silicon, which can be removed with a liquid mixture of ammonium fluoride ($NH_4F$) and hydrofluoric acid (HF) in a molar ratio of about 30:1; the substance gold produces build-ups which can be removed with a water solution of about 40% by weight potassium iodide (KI) and 20% iodine ($I_2$). In the cases where the substance is thus silicon, silicon dioxide, or gold, the patterned organic layer can be completely removed by a treatment with a solution of sulfuric acid and hydrogen peroxide and the molar ratio of 5:1.

What is claimed is:

1. In a method of processing a film, said film having a major surface coated with a layer of substance and said method including selectively etching the film using as a selective etch mask a patterned organic layer which has been patterned with windows, said windows formed by means of a first reactive ion etching step whereby said windows penetrate through the organic layer to the layer of substance, the step of removing build-ups of compounds of the substance from sidewalls of the windows prior to said selectively etching the layer of substance.

2. The method of claim 1 in which said etching step is reactive oxygen ion etching.

3. The method of claim 2 in which said substance is aluminum.

4. The method of claim 3 in which the step of removing said build-ups is performed by treating the build-ups with a mixture of ethylene glycol and buffered hydrochloric acid.

5. The method of claims 2, 3, or 4 in which the patterned organic layer is removed by a second reactive ion etching step after said layer of substance has been selectively etched using the patterned organic layer as an etch mask.

6. The method of claim 5 in which said second reactive ion etching step is substantially isotropic oxygen ion etching.

7. The method of claim 6 in which said etching of said layer of substance is performed in a chamber and in which said second ion etching step is performed in said chamber.

8. In a method of processing a film having a major surface thereof initially everywhere coated with a layer of substance which is then selectively etched using, as a selective mask against said etching, an organic layer which has been patterned with windows, said windows penetrating through the organic layer to the layer of substance, and said windows having been formed by a reactive oxygen ion anisotropic etching step, the step of:

removing build-ups of oxides of said substance from sidewalls of said window prior to said selectively etching the layer of substance.

9. The method of claim 8 in which the substance is aluminum.

10. The method of claim 9 in which the step of removing the build-ups includes the step of treating the build-ups with a solution of ethylene glycol and buffered hydrofluoric acid.

11. The method of claim 8, 9, or 10 in which the patterned organic layer is completely removed by a substantially isotropic ion etching step after said layer of substance has been selectively etched using the patterned organic layer as an etch mask.

12. The method of claim 11 in which said substantially isotropic etching step is essentially oxygen ion etching.

13. The method of claim 12 in which said selective etching of said layer of substance is performed in a chamber and in which said substantially isotropic etching step is performed in said chamber.

14. The method of claim 8 in which the substance is silicon.

15. The method of claim 14 in which the step of removing the build-ups includes the steps of treating the build-ups with a liquid mixture of ammonium fluoride and hydrofluoric acid.

16. The method of claim 8 in which the substance is silicon dioxide.

17. The method of claim 16 in which the step of removing the build-ups includes the step of treating the build-ups with a liquid mixture of ammonium fluoride and hydrofluoric acid.

18. The method of claim 8 in which the substance is gold.

19. The method of claim 18 in which the step of removing the build-ups includes the step of treating the build-ups with a water solution of potassium iodide and iodine.

20. The method of claim 14, 15, 16, 17, 18, or 19 in which the patterned organic layer is completely removed by a substantially isotropic ion etching step after said layer of substance has been selectively etched using the patterned organic layer as an etch mask.

21. The method of claim 20 in which said substantially isotropic etching step is essentially oxygen ion etching.

22. The method of claim 21 in which said selective etching of said layer of substance is performed in a chamber and in which said substantially isotropic etching step is performed in said chamber.

* * * * *